(12) United States Patent
Pietambaram et al.

(10) Patent No.: US 10,707,410 B2
(45) Date of Patent: *Jul. 7, 2020

(54) MAGNETORESISTIVE STACKS WITH AN UNPINNED, FIXED SYNTHETIC ANTI-FERROMAGNETIC STRUCTURE AND METHODS OF MANUFACTURING THEREOF

(71) Applicant: Everspin Technologies, Inc., Chandler, AZ (US)

(72) Inventors: Srinivas V. Pietambaram, Gilbert, AZ (US); Bengt J. Akerman, Sollentuna (SE); Renu Whig, Chandler, AZ (US); Jason A. Janesky, Gilbert, AZ (US); Nicholas D. Rizzo, Gilbert, AZ (US); Jon M. Slaughter, Albany, NY (US)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/225,670

(22) Filed: Dec. 19, 2018

(65) Prior Publication Data

US 2019/0123266 A1 Apr. 25, 2019

Related U.S. Application Data

(60) Continuation of application No. 15/722,191, filed on Oct. 2, 2017, now Pat. No. 10,199,571, which is a
(Continued)

(51) Int. Cl.
*H01L 43/08* (2006.01)
*H01L 43/10* (2006.01)
(Continued)

(52) U.S. Cl.
CPC ............ *H01L 43/08* (2013.01); *G11C 11/161* (2013.01); *H01L 43/02* (2013.01); *H01L 43/10* (2013.01); *H01L 27/222* (2013.01)

(58) Field of Classification Search
CPC .......... H01L 43/08; H01L 43/02; H01L 43/10
See application file for complete search history.

(56) References Cited

U.S. PATENT DOCUMENTS 5,372,698 A * 12/1994 Liao .................... G11B 5/3109
205/119
5,583,725 A 12/1996 Coffey et al.
(Continued)

*Primary Examiner* — Marc Anthony Armand
(74) *Attorney, Agent, or Firm* — Bookoff McAndrews, PLLC

(57) ABSTRACT

A magnetoresistive magnetic tunnel junction (MTJ) stack includes a free magnetic region, a fixed magnetic region, and a dielectric layer positioned between the free magnetic region and the fixed magnetic region. In one aspect, the fixed magnetic region consists essentially of an unpinned, fixed synthetic anti-ferromagnetic (SAF) structure which comprises (i) a first layer of one or more ferromagnetic materials, including cobalt, (ii) a multi-layer region including a plurality of layers of ferromagnetic materials, wherein the plurality of layers of ferromagnetic materials include a layer of one or more ferromagnetic materials including cobalt, and (iii) an anti-ferromagnetic coupling layer disposed between the first layer and the multi-layer region. The free magnetic region may include a circular shape, the one or more ferromagnetic materials of the first layer may include cobalt, iron and boron, and the dielectric layer may be disposed on the first layer.

20 Claims, 2 Drawing Sheets

Related U.S. Application Data continuation of application No. 15/199,862, filed on Jun. 30, 2016, now Pat. No. 9,793,468, which is a division of application No. 14/727,910, filed on Jun. 2, 2015, now Pat. No. 9,391,264, which is a division of application No. 14/303,200, filed on Jun. 12, 2014, now Pat. No. 9,093,637, which is a division of application No. 13/925,590, filed on Jun. 24, 2013, now Pat. No. 8,754,460, which is a division of application No. 11/444,089, filed on May 31, 2006, now Pat. No. 8,497,538.

(51) Int. Cl.
*H01L 43/02* (2006.01)
*G11C 11/16* (2006.01)
*H01L 27/22* (2006.01)

(56) References Cited

U.S. PATENT DOCUMENTS

| | | | |
|---|---|---|---|
| 6,545,906 | B1 | 4/2003 | Savtchenko et al. |
| 7,151,653 | B2 | 12/2006 | Mauri et al. |
| 7,221,545 | B2 | 5/2007 | Gill |
| 7,242,047 | B2 | 7/2007 | Mori et al. |
| 7,369,429 | B2 * | 5/2008 | Tanizaki ............ G11C 11/16 365/158 |
| 8,497,538 | B2 | 7/2013 | Pietambaram et al. |
| 8,754,460 | B2 | 6/2014 | Pietambaram et al. |
| 9,093,637 | B2 | 7/2015 | Pietambaram et al. |
| 9,391,264 | B2 | 7/2016 | Pietambaram et al. |
| 9,793,468 | B2 | 10/2017 | Pietambaram et al. |
| 10,199,571 | B2 * | 2/2019 | Pietambaram ......... H01L 43/08 |
| 2004/0264069 | A1 | 12/2004 | Freitag et al. |
| 2005/0047198 | A1 | 3/2005 | Engel et al. |
| 2007/0183187 | A1 | 8/2007 | Guo |
| 2010/0148167 | A1 | 6/2010 | Whig et al. |

\* cited by examiner

MAGNETORESISTIVE STACKS WITH AN UNPINNED, FIXED SYNTHETIC ANTI-FERROMAGNETIC STRUCTURE AND METHODS OF MANUFACTURING THEREOF

CROSS REFERENCE TO RELATED APPLICATIONS

This application is a continuation of U.S. patent application Ser. No. 15/722,191, filed Oct. 2, 2017, which is a continuation of U.S. patent application Ser. No. 15/199,862, filed Jun. 30, 2016, (now U.S. Pat. No. 9,793,468), which is a divisional of U.S. patent application Ser. No. 14/727,910, filed Jun. 2, 2015 (now U.S. Pat. No. 9,391,264), which is a divisional of U.S. patent application Ser. No. 14/303,200, filed Jun. 12, 2014 (now U.S. Pat. No. 9,093,637), which is a divisional of U.S. patent application Ser. No. 13/925,590, filed Jun. 24, 2013 (now U.S. Pat. No. 8,754,460), which is a divisional of U.S. patent application Ser. No. 11/444,089, filed May 31, 2006 (now U.S. Pat. No. 8,497,538), each of which is incorporated by reference herein in its entirety.

FIELD OF THE INVENTION

The present invention generally relates to MRAM devices and more particularly to magnetoresistive random access memories having a synthetic anti-ferromagnet structure without a pinning layer.

BACKGROUND OF THE INVENTION

Memories comprise one of the largest markets for semiconductor integrated circuits. In general, a memory is a storage device that retains information or data that can be output when needed. Memory devices are often characterized under such names as high speed, high density, or non-volatile memories. A high speed memory, as its name implies, is a device having extremely fast read/write times that are useful in situations where data transfer rates are critical. A high density memory has a substantial memory size for large storage capability. The most common high density solid state memory is a dynamic random access memory (DRAM). A non-volatile memory is a memory that retains information even when power is removed and is thereby a permanent storage medium. A common non-volatile memory is FLASH memory. In general, an ideal memory has characteristics of all of the above mentioned types of memory.

FLASH memory uses charge storage in a floating gate to retain information. FLASH memories operate at relatively high voltages, running counter to the trend of reducing power supply voltages for other high density integrated circuits. Moreover, they have slow program and erase times. The ability to write or store charge in the floating gate is limited to a finite number of times that can be exceeded depending on the application. Memory failure occurs if the maximum number of writes is exceeded. FLASH memory is presently limited for high density applications because it cannot be continually scaled to smaller dimensions due to gate oxide limitations.

Another type of non-volatile memory is a magnetoresistive random access memory (MRAM). MRAM has the characteristics of an ideal memory as it is a high density memory, is scalable, requires low voltage, and has low power consumption and high speed read/write times. A magnetoresistive memory cell comprises a magnetic tunnel junction (MJT) and includes ferromagnetic layers separated by an insulating dielectric. Electrons tunnel through the dielectric, known as a tunnel barrier, from a first ferromagnetic layer to a second ferromagnetic layer. The direction of the magnetization vectors in the ferromagnetic layers determines the tunneling resistance. A zero logic state is represented when the magnetization directions are parallel which corresponds to a low tunneling resistance for the magnetic tunneling junction. Conversely, a one logic state is represented when the magnetization states are anti-parallel which corresponds to a high tunneling resistance. Typically, a magnetic vector in a first magnetic layer is fixed or pinned, while the magnetization direction of a second magnetic layer is free to switch between the same and opposite (anti-parallel) directions. The memory is non-volatile because the ferromagnetic material holds the magnetization vectors when the memory is not powered. It should be noted that the selection of the parallel state or the anti-parallel state as a logic one or zero state is arbitrary.

Typically, in MRAM and related magnetic sensor technology, the fixed layer is a pinned synthetic anti-ferromagnet (SAP). SAP structures are well known in literature and generally comprise two ferromagnetic layers of equal magnetic moment, separated by a spacer layer that provides anti-ferromagnetic coupling between them. Due to the anti-ferromagnetic coupling, the moments of the ferromagnetic layers point in opposite directions in the absence of an applied field. The strength of the SAF is typically expressed in terms of the saturation field $H_{sat}$, which is the field needed to force the moments of the layers parallel to each other. A unique feature of a SAF with a well-defined magnetic anisotropy is the flop behavior. As an external field increases, the moments suddenly turn perpendicular to the field when it reaches a critical value called the flop field $H_{flop}$. Practically, the moments of the ferromagnetic layers start to move in the vicinity of the flop field. Flop field is determined by the uniaxial anisotropy ($H_k$) of the layers and the saturation field ($H_{sat}$) of the SAF. Uniaxial anisotropy is the field needed to saturate the magnetic moment of a film along its hard axis. To increase the field where the SAF starts to move, or in other words, the moments of the layers start to move, it is a common practice in the industry to use a pinning layer. The pinning layer fixes the moment of the FM layer adjacent to it in a particular direction, which in turn sets the direction of the other layer in the SAF. Typical pinning layers used are Mn-based alloys, such as IrMn, PtMn, etc. A high temperature anneal is needed for the pinning layer to pin the FM layer adjacent to it. The pinned SAF has certain disadvantages and problems associated with it. Some of the reliability problems are associated with Mn diffusion from the pinning layer. Also, the alloy typically used as the pinning material, PtMn, is very costly and needs a very high temperature anneal for pinning, thereby increasing the thermal budget. Addition of a layer always adds complexity to the MTJ stack. A fixed SAF with no pinning layer overcomes and embodies the above mentioned problems and advantages.

The use of un-pinned SAFs as a fixed layer is disclosed in U.S. Pat. No. 5,583,725; however, the patent does not describe the specific alloys and particular material stacks that are needed for the toggle MRAM described in U.S. Pat. No. 6,545,906, that certain magnetic criteria need to be met regardless of which specific alloy is used, or that the fixed layer needs to be set in a particular direction for all the bits for proper device operation.

The role of a fixed SAF is to remain rigid while the fields are used to switch the free-layer, which can be a single free layer or a SAF (introduced by U.S. Pat. No. 6,545,906). The magnitude of the field where the free layer switches is defined as the switching field. If the fixed SAF magnetic moments rotate even slightly during switching, the switching distributions of the free layer will be broadened and memory operation will be compromised. To be magnetically rigid enough for practical use, the SAP structures should exhibit a high saturation field as well as a well-defined high flop field. A high and well-defined flop field is an important requirement that is essential regardless of which specific alloy is used, as it ensures that the magnetic moments of the fixed SAF do not rotate while the free layer is switching.

Another issue associated with a pinning-free structure is finding a way to set the direction of the fixed layer to be the same for all bits in all die on the wafer. This issue arises because, in the absence of a pinning layer, the SAF is equally likely to be in either of the two stable magnetic states with the fixed layer moment either to the right or to the left.

Accordingly, it is desirable to provide a pinning-free synthetic anti-ferromagnetic structure incorporating all the above requirements for use in conjunction with the toggle magnetoresistive random access memory array. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
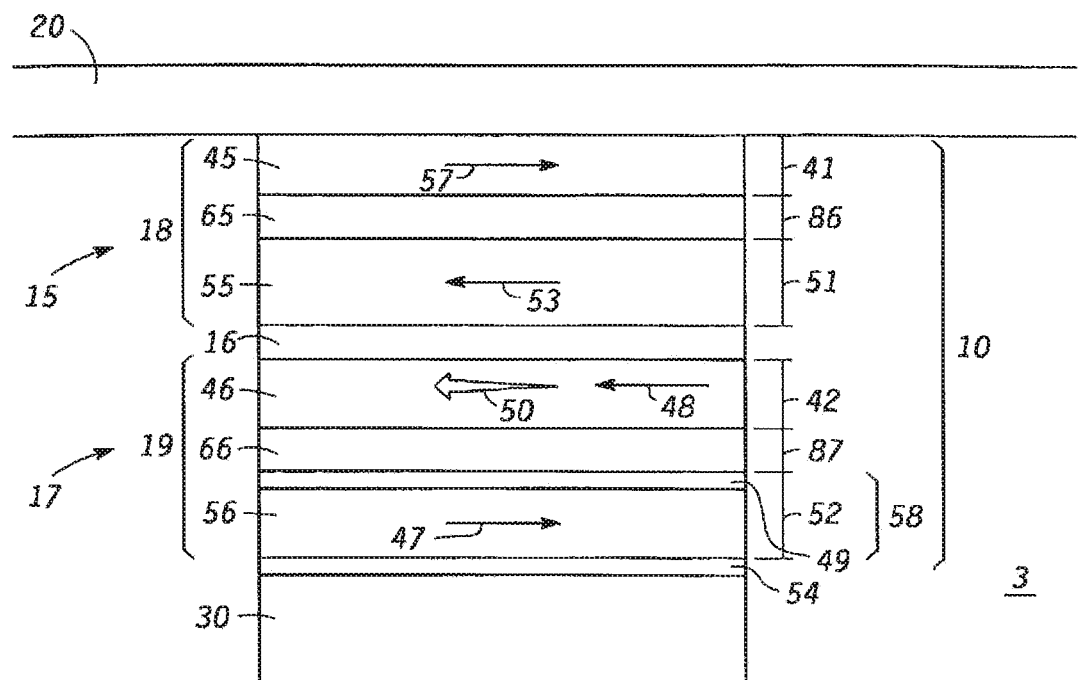
FIG. 1 is a cross-sectional view of a magnetic tunnel junction bit in accordance with an exemplary embodiment.

The following detailed description of the invention is merely exemplary in nature and is not intended to limit the invention or the application and uses of the invention. Furthermore, there is no intention to be bound by any theory presented in the preceding background of the invention or the following detailed description of the invention.

The exemplary embodiment described herein is a SAF structure exhibiting a well-defined high $H_{flop}$ (flop field) using a combination of high $H_k$ (uniaxial anisotropy), high $H_{sat}$ (saturation field), and ideal soft magnetic properties exhibiting well-defined easy and hard axes. The exemplary embodiment comprises an amorphous Cobalt-Iron-Boron-based (CoFeB) SAF grown on Tantalum (Ta), with a Cobalt-Iron (CoFe) insertion layer at the bottom interface of the spacer to boost $H_{sat}$. This structure has been shown to have the combination of sufficiently high $H_{sat}$ and well-defined high $H_k$ with the desired soft magnetic behavior. This exemplary embodiment eliminates the need for a pinning layer in MRAM devices.

CoFe-based alloys are generally known to exhibit high saturation fields; however, other alloy SAFs exhibiting desirable properties as described herein can be used as well. A well-defined and high flop field is an essential requirement in addition to a high saturation field. The first step is to grow soft/well-behaved (well-defined easy and hard axis, low coercivity and high $H_k$) single layer films of CoFe/CoFe-based alloys. Films with these above mentioned desirable properties are achieved when grown on a Ta seed layer. Using the above mentioned seed, soft CoFe-based films (CoFe, CoFeB with different Boron compositions) with coercivities <5.0 Oe and $H_k$>30.0 Oe are achievable.

SAFs grown with these alloys exhibit high $H_{sat}$. CoFe provides the highest $H_{sat}$; however, at or near balance these SAFs did not exhibit a well-defined $H_{flop}$. The flop field shows up in a magnetization-versus-field (M-H) loop as a sharp slope change from a flat region at low field to a steep slope when the SAF moves approximately 90 degrees to the applied field. With the CoFe SAFs, the flat-region disappears, indicating changes in the magnetization direction, something that broadens the free layer transition. Amorphous CoFeB SAFs, on the other hand, retain the flat, well-defined flop at balance. When the boron composition in the CoFeB is decreased too much, the alloy becomes crystalline and the flat region is no longer well defined, i.e., crystalline CoFeB behaves similar to CoFe and is therefore not suitable. These SAFs, which have no well-defined flop, are not rigid and will move when a field is applied, though the saturation fields are high. Amorphous CoFeB (B>9%) with a thin CoFe at the bottom interface to boost $H_{sat}$ exhibits desirable properties. $H_{sat}$ preferably is greater than 1500 Oe. These SAFs exhibit similar MR as the ones with pinned SAF. Having CoFe at one interface is desirable for increasing $H_{sat}$, but introducing CoFe on both the interfaces caused the disappearance of the flop region similar to that observed in an all CoFe or crystalline CoFeB SAFs.

FIG. 1 is a simplified sectional view of an MRAM array 3 in accordance with the exemplary embodiment. In this illustration, only a single magnetoresistive memory bit 10 is shown, but it will be understood that MRAM array 3 includes a number of MRAM bits 10 and only one such bit is shown for simplicity.

Figure 2:
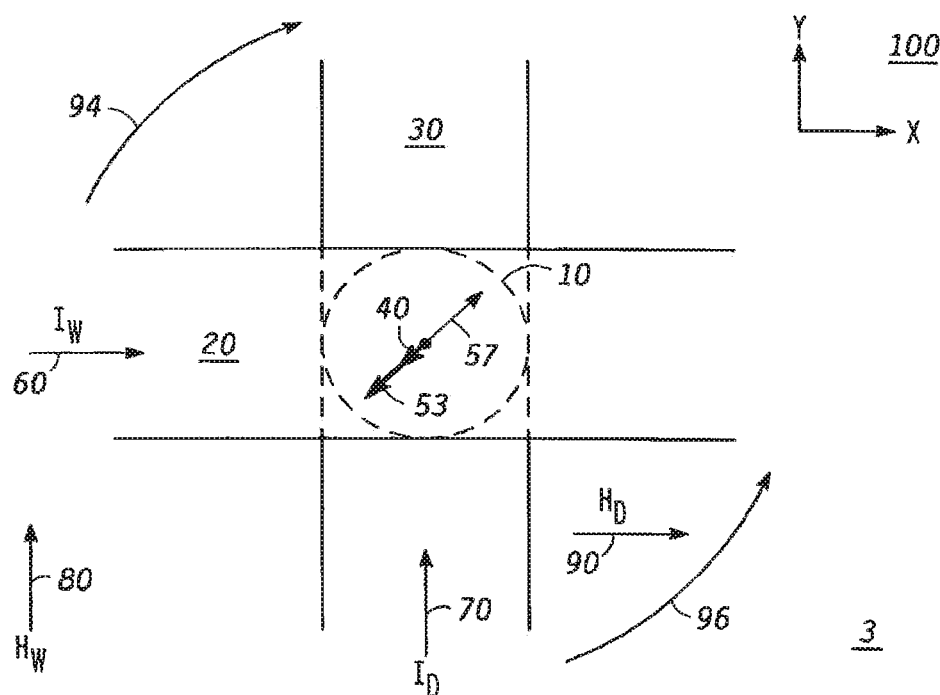
FIG. 2 is a simplified plan view of the magnetic tunnel junction bit of FIG. 1 with bit and digit lines.

MRAM bit 10 is sandwiched between a bit line 20 and a digit line 30. Bit line 20 and digit line 30 include conductive material such that a current can be passed there through. In this illustration, bit line 20 is positioned on top of MRAM bit 10 and digit line 30 is positioned on the bottom of MRAM bit 10 and is directed at a 90° angle to bit line 20 as shown in FIG. 2.

MRAM bit 10 includes a free magnetic region 15, a tunneling barrier 16, and a fixed magnetic region 17, wherein tunneling barrier 16 is sandwiched between free magnetic region 15 and fixed magnetic region 17. In this exemplary embodiment, free magnetic region 15 includes a tri-layer structure 18, which has an anti-ferromagnetic coupling spacer layer 65 sandwiched between two ferromagnetic layers 45 and 55. Anti-ferromagnetic coupling spacer layer 65 has a thickness 86 and ferromagnetic layers 45 and 55 have thicknesses 41 and 51, respectively. Further, fixed magnetic region 17 has a tri-layer structure 19, which has an anti-ferromagnetic coupling spacer layer 66 sandwiched between two ferromagnetic layers 46 and 58. The fixed magnetic region 17 is formed on a suitable seed layer 54 such as Tantalum. The magnetic bit 10 contacts the bit line 30 and digit line 20 through bottom and top electrodes (not shown). Anti-ferromagnetic coupling spacer layer 66 has a thickness 87 and ferromagnetic layers 46 and 58 have thicknesses 42 and 52, respectively.

Generally, anti-ferromagnetic coupling spacer layers 65 and 66 include at least one of the elements Ruthenium, Rhodium, Chromium, Vanadium, Molybdenum, for example, or combinations thereof and alloys of these such as Ruthenium-Tantalum. Further, ferromagnetic layers 45 and 55 include at least one of elements Nickel, Iron, Cobalt, or combinations thereof. In accordance with the exemplary embodiment, ferromagnetic layers 46 and 58 comprise Cobalt-Iron-Boron. Also, it will be understood that magnetic regions 15 and 17 can include material structures other than tri-layer structures and the use of tri-layer structures in this embodiment is for illustrative purposes only. For example, one such material structure could include a five-layer stack of a ferromagnetic layer/anti-ferromagnetic coupling spacer layer/ferromagnetic layer/anti-ferromagnetic coupling spacer layer/ferromagnetic layer structure. Another exemplary material structure for layer 15 would include a single ferromagnetic layer.

Ferromagnetic layers 45 and 55 each have a magnetic moment vector 57 and 53, respectively, that are usually held anti-parallel by coupling of the anti-ferromagnetic coupling spacer layer 65. Also, in some embodiments, the fixed magnetic region 17 has a resultant magnetic moment vector 50. The resultant magnetic moment vector 50 is oriented along an anisotropy easy-axis in a direction that is at an angle, for example between 30° to 60°, but preferably 45°, from bit line 20 and digit line 30 (see FIG. 2). Further, magnetic region 15 is a free ferromagnetic region, meaning that magnetic moment vectors 53 and 57 are free to rotate in the presence of an appropriately applied magnetic field. Magnetic region 17 is a fixed ferromagnetic region, meaning that the magnetic moment vectors 47 and 48 are not free to rotate in the presence of a moderate applied magnetic field. Layer 46 is the reference layer, meaning that the direction of its magnetic moment vector 48 determines which free layer magnetic states will result in high and low resistance. Ferromagnetic layer 58 having a magnetic moment 47, which could be either a single layer or a double layer, comprises ferromagnetic layer 56 and ferromagnetic interlayer 49, would be the pinned layer in conventional pinned SAF structures, but in this bit structure 10 the tri-layer structure 19 is designed so that a pinning layer beneath layer 58 is unnecessary.

The MRAM bit 10 does not have a pinning layer positioned contiguous to and for influencing the vector 50 within the fixed magnetic region 17. This is accomplished by fabricating the ferromagnetic layers 46 and 58 so that they exhibit a well-defined and sufficiently-high $H_{flop}$; using a combination of high $H_k$ (uniaxial anisotropy), high $H_{sat}$ (saturation field), and ideal soft magnetic properties exhibiting well-defined easy and hard axes.

The fixed SAF with no pinning layer provides several advantages over the conventional pinned SAFs. Some of these advantages are: (a) Simplified MTJ stack, (b) reduced cost (PtMn, pinning material typically used is the most expensive part of the MTJ stack), (c) an anneal step that is optimized for the MTJ stack rather than the pinning material (which is usually a higher temperature and for a longer time) and (d) reduced Mn diffusion related problems.

The exemplary embodiment comprises an amorphous Cobalt-Iron-Boron-based fixed SAF with different Boron compositions, grown on Tantalum, with a CoFe insertion layer 49 at the bottom interface of the spacer to boost $H_{sat}$. The CoFe-based films preferably comprise coercivities of less than 5.0 Oe and $H_k$ greater than 10 Oe and preferably greater than 15 Oe. This structure has been shown to have the combination of sufficiently high $H_{sat}$ and well-defined high $H_k$ with the desired soft magnetic behavior.

While anti-ferromagnetic coupling layers 65 and 66 are illustrated between the two ferromagnetic layers in each tri-layer structure 18 and 19, it will be understood that the ferromagnetic layers 45, 55, 46, 58 could be anti-ferromagnetically coupled through other means, such as magnetostatic fields or other features. For example, when the aspect ratio of a cell is reduced to five or less, the ferromagnetic layers are anti-parallel coupled from magnetostatic flux closure.

MRAM bit 10 has tri-layer structures 18 that have a length/width ratio in a range of 1 to 5 for a non-circular plan. It will be understood that MRAM bit 10 can have various shapes, such as square, elliptical, rectangular, or diamond, but is illustrated in FIG. 2 as being circular for simplicity.

Further, during fabrication of MRAM array 3, each succeeding layer (i.e. 30, 54, 58, 66, 46, 16, 55, 65, etc.) is deposited or otherwise formed in sequence and each MRAM bit 10 may be defined by selective deposition, photolithography processing, etching, etc. in any of the techniques known in the semiconductor industry. During deposition of at least the ferromagnetic layers 45 and 55, a magnetic field may be provided to set a preferred easy magnetic axis for this pair (induced anisotropy). Similarly, a strong magnetic field applied during the post-deposition anneal step may induce a preferred easy axis. In addition, the bits are typically patterned to be longer in one direction, resulting in a shape anisotropy that favors the long axis of the bit.

It is desirable to have the magnetic vector within the ferromagnetic layer 46 pointing in a particular direction. However, in case of a balanced SAF, this is difficult because the symmetric nature of the structure means it is equally likely for the structure to end up in either of the two stable states after the high-field anneal process step. The measured resistance vs. field (R-H) loops for perfectly balanced SAFs illustrate that, since some curves have increasing resistance as the external field H is turned up and others have decreasing resistance with increasing H, some of the bottom SAFs set in one direction and some in the other.

This is controllable by introducing symmetry breakers in the reference SAF. A slightly magnetically imbalanced structure makes the fixed SAFs fall into a preferred state when removed from the high-field used for the high-field anneal step. An imbalance may be accomplished by making one layer slightly thicker than the other, generating a net magnetic moment 50 for the trilayer structure 10. A small amount of imbalance is sufficient to make the fixed layer in all the bits to go to the same direction. Too much imbalance in the SAF is not preferred due to various reasons. If the imbalance is too high, then we have a magnetic field acting on the bits from the imbalanced layer which influences device characteristics, which is undesirable. Also, too much of an imbalance will change flop behavior of the SAF. For best operation, the imbalance should be between 0.5% and 10%.

Figure 3:
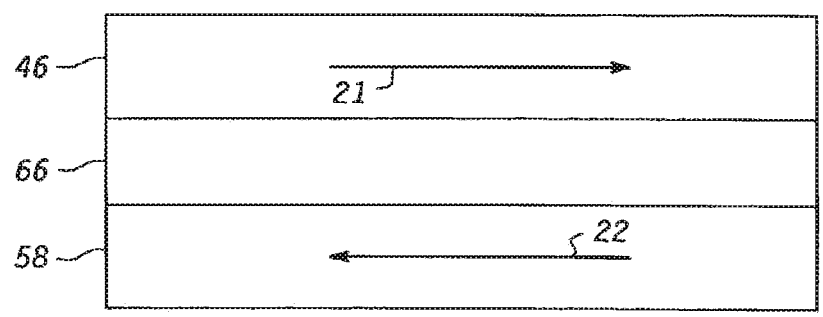
FIG. 3 is a partial cross-sectional view of an exemplary embodiment of a magnetic region within a magnetic tunnel junction bit.

Another structure involving symmetry breaking without imbalancing the moment comprises the fixed magnetic region 17 (SAP) where the intrinsic $H_k$ is different for the two ferromagnetic layers 46 and 58 (see FIG. 3). For example, different alloys of NiFe or CoFe can be chosen to give a factor of 2 to 4 difference in $H_k$, where vector 21 comprises a first $H_k$ and vector 22 comprises a second $H_k$. The $H_k$ difference gives an anisotropy energy difference for the two layers. Therefore, even after saturation from a large external field, the layer with the higher $H_k$ will stay closer to the applied field direction so as to minimize energy. Then the lower $H_k$ layer will be the one to reverse.

Figure 4:
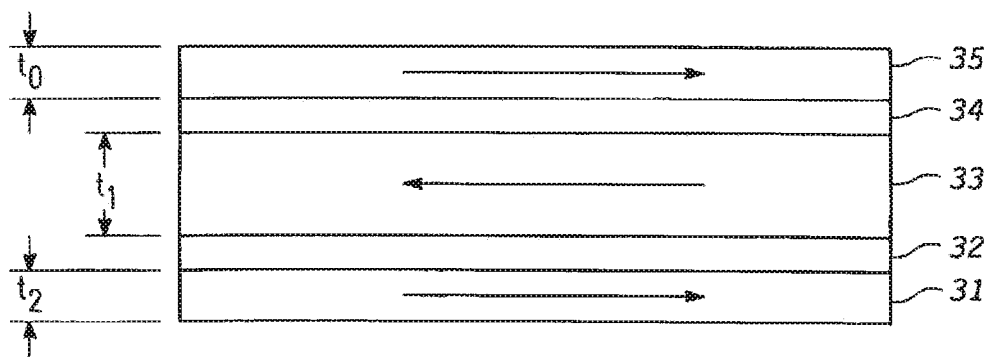
FIG. 4 is a partial cross-sectional view of another exemplary embodiment of a magnetic region within a magnetic tunnel junction bit.

Yet another symmetry breaking structure for the fixed magnetic region 17 comprises a triple SAF shown in FIG. 4. This structure consists of a middle ferromagnetic layer 33 of thickness $t_1$, and upper and lower ferromagnetic layers 35 and 31 respectively, of thickness to and $t_2$ respectively. Anti-ferromagnetic coupling spacer layers 32 and 34 are positioned between ferromagnetic layers 31 and 33, and ferromagnetic layers 33 and 35, respectively. For this structure, $t_1 \approx 2t_0 \approx 2t_2$. In this way, the moment is approximately balanced, but the dipole energy for the middle ferromagnetic layer 33 is twice that of either outer ferromagnetic layer 31 and 35. In addition, the shape anisotropy for the middle ferromagnetic layer 33 is twice that of the outer ferromagnetic layers 31 and 35. The net result is that after saturation, the thicker middle ferromagnetic layer 33 remains pointing in the field direction while the thinner ferromagnetic outer layers reverse.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A method of fabricating a magnetoresistive magnetic tunnel junction (MTJ) stack, comprising:
    forming a free magnetic region having at least one layer of one or more ferromagnetic materials;
    forming a fixed magnetic region consisting essentially of an unpinned, fixed synthetic anti-ferromagnetic (SAF) structure, wherein forming the fixed magnetic region includes:
        forming a first layer of one or more ferromagnetic materials, wherein the one or more ferromagnetic materials includes cobalt;
        forming a second layer of one or more ferromagnetic materials;
        forming an anti-ferromagnetic coupling layer between the first layer and the second layer; and
        forming a third layer of one or more ferromagnetic materials between the first layer and the anti-ferromagnetic coupling layer; and
    forming a dielectric layer between the free magnetic region and the fixed magnetic region.

2. The method of claim 1, wherein the first layer includes an alloy having cobalt, iron, and boron, and the third layer includes an alloy having cobalt and iron.

3. The method of claim 2, wherein the first layer includes an amorphous crystalline structure.

4. The method of claim 2, wherein the second layer includes an alloy having cobalt, iron, and boron.

5. The method of claim 4, wherein the second layer includes an alloy having a different boron concentration than the first layer.

6. The method of claim 1, wherein forming the third layer includes forming the third layer on the first layer.

7. The method of claim 1, wherein forming the first layer includes forming the first layer using a cobalt-boron alloy, and forming the second layer includes forming the second layer using a cobalt-boron alloy on the anti-ferromagnetic coupling layer.

8. The method of claim 7, wherein the second layer includes an alloy having a different boron concentration than the first layer.

9. The method of claim 8, wherein the first layer includes a cobalt-iron-boron alloy, and the second layer also includes a cobalt-iron-boron alloy.

10. The method of claim 1, wherein the second layer a different thickness than the first layer.

11. A method of fabricating a magnetoresistive magnetic tunnel junction (MTJ) stack, comprising:
    forming a free magnetic region having at least one layer of one or more ferromagnetic materials;
    forming a fixed magnetic region consisting essentially of an unpinned, fixed synthetic anti-ferromagnetic (SAF) structure, wherein forming the fixed magnetic region includes:
        forming a first layer including a cobalt-iron-boron alloy;
        forming a second layer including a cobalt-iron-boron alloy;
        forming an anti-ferromagnetic coupling layer between the first layer and the second layer; and
        forming a third layer including a cobalt-iron alloy between the first layer and the anti-ferromagnetic coupling layer; and
    forming a dielectric layer between the free magnetic region and the fixed magnetic region.

12. The method of claim 11, wherein the second layer includes a different boron concentration than the first layer.

13. The method of claim 11, wherein the second layer includes a different thickness than the first layer.

14. The method of claim 11, wherein forming the third layer includes forming the third layer on the first layer.

15. The method of claim 14, wherein forming the anti-ferromagnetic coupling layer includes forming the anti-ferromagnetic coupling layer on the third layer.

16. The method of claim 11, wherein the first layer includes an amorphous crystalline structure.

17. A method of fabricating a magnetoresistive magnetic tunnel junction (MTJ) stack, comprising:
    forming a free magnetic region having at least one layer of one or more ferromagnetic materials;
    forming a fixed magnetic region consisting essentially of an unpinned, fixed synthetic anti-ferromagnetic (SAF) structure, wherein forming the fixed magnetic region includes:
        forming a first layer including a cobalt-iron-boron alloy;
        forming a second layer including a cobalt-iron-boron alloy, wherein the second layer includes at least one of (a) a different boron concentration than the first layer, or (b) a different thickness than the first layer;
        forming an anti-ferromagnetic coupling layer between the first layer and the second layer; and
        forming a third layer including a cobalt-iron alloy between the first layer and the anti-ferromagnetic coupling layer; and
    forming a dielectric layer between the free magnetic region and the fixed magnetic region.

18. The method of claim 17, wherein the first layer includes an amorphous crystalline structure.

19. The method of claim 17, wherein forming the third layer includes forming the third layer on the first layer.

20. The method of claim 17, wherein forming the antiferromagnetic coupling layer includes forming the antiferromagnetic coupling layer on the third layer.

* * * * *